United States Patent [19]
Heidemann et al.

[11] Patent Number: 5,297,154
[45] Date of Patent: Mar. 22, 1994

[54] FIBER-OPTIC AMPLIFIER WITH FEEDBACK-INSENSITIVE PUMP LASER

[75] Inventors: Rolf Heidemann, Tamm; Jürgen Otterbach, Leonberg, both of Fed. Rep. of Germany

[73] Assignee: Alcatel SEL A.G., Stuttgart, Fed. Rep. of Germany

[21] Appl. No.: 56,305

[22] Filed: Apr. 30, 1993

[30] Foreign Application Priority Data

May 4, 1992 [DE] Fed. Rep. of Germany ....... 4214766

[51] Int. Cl.$^5$ .......................... H01S 3/30; H01S 3/00; G02B 6/26
[52] U.S. Cl. .......................... 372/6; 372/38; 372/70; 372/69; 372/43; 359/333; 359/341; 359/345; 385/42; 385/31; 385/39
[58] Field of Search ...................... 372/6, 7, 38, 43, 50, 372/108, 109, 69, 70, 71; 359/333, 341, 342, 345, 173, 133, 134; 385/42, 49, 39, 44, 15, 24, 31

[56] References Cited

U.S. PATENT DOCUMENTS

| | | | |
|---|---|---|---|
| 5,018,154 | 5/1991 | Ohashi | 372/38 X |
| 5,058,976 | 10/1991 | DiGiovanni et al. | 385/24 X |
| 5,101,461 | 3/1992 | Nakajima | 372/7 X |
| 5,138,483 | 8/1992 | Grasso et al. | 372/6 X |
| 5,138,621 | 8/1992 | Goto et al. | 372/38 |
| 5,191,586 | 3/1993 | Huber | 372/6 |
| 5,218,608 | 6/1993 | Aoki | 372/6 |
| 5,222,070 | 6/1993 | Niki | 372/38 X |
| 5,222,089 | 6/1993 | Huber | 372/6 X |
| 5,239,607 | 8/1993 | da Silva et al. | 372/6 X |
| 5,243,610 | 9/1993 | Murata | 372/21 |

FOREIGN PATENT DOCUMENTS

| | | | |
|---|---|---|---|
| 2820426 | 4/1985 | Fed. Rep. of Germany | 372/6 X |
| 59-184581 | 10/1984 | Japan | 372/6 X |
| 2244595 | 12/1991 | United Kingdom | 372/6 X |

OTHER PUBLICATIONS

"Compact and Highly Efficient Fiber Amplifier Modules Pumped by a 0.98-um Laser Diode"—Journal of Lightwave Technology, vol. 9, No. 2, Feb. 1991, pp. 291 to 295, by M. Shimizu et al.

"Trunk and Distribution Network Application of Erbium-Doped Fiber Amplifier"—Journal of Lightwave Technology, vol. 9, No. 2, Feb. 1991, pp. 198 to 208, by K. Nakagawa et al.

"Multichannel Crosstalk and Pump Noise Characterisation of $ER^{3+}$-Doped Fibre Amplifier Pumped at 980 nm" by R. I. Laming et al, Electronics Letters, Mar. 30, 1989, vol. 25, No. 7, pp. 455–456.

Patent Abstracts of Japn, vol. 16, No. 139 (P-1334) Apr. 8, 1992 & JP-A-04 000 418 (Mitsubishi Electric) Jan. 6, 1992.

*Primary Examiner*—Brian Healy
*Attorney, Agent, or Firm*—Ware, Fressola, Van Der Sluys & Adolphson

[57] ABSTRACT

Prior art fiber-optic amplifiers which are used in a fiber-optic link to amplify the light signals to be transmitted have the disadvantage that the semiconductor lasers employed as pump lasers are highly sensitive to feedback, so that the stability of the light-signal transmission is impaired by pump light reflected back into the pump lasers.

According to the invention, the operating current for such pump lasers (4) contains a noise current, so that the pump laser emits its pump light in many modes, which makes it insensitive to feedback.

To prevent the noise component of the pump light which is caused by the noise current from affecting the amplification of the light signals to be transmitted, the noise current is filtered in such a way that its spectral components have frequencies which lie above the reciprocal lifetime of that energy level of the active laser medium which causes the amplification of the light signals.

4 Claims, 1 Drawing Sheet

FIBER-OPTIC AMPLIFIER WITH FEEDBACK-INSENSITIVE PUMP LASER

TECHNICAL FIELD

The present invention relates to a fiber-optic amplifier, and more particularly, to an amplifying section of fiber coupled to a pump source.

BACKGROUND OF THE INVENTION

A fiber-optic amplifier with the features recited there is known from M. Shimizu et al, "Compact and Highly Efficient Fiber Amplifier Modules Pumped by a 0.98-μm Laser Diode", Journal of Lightwave Technology, Vol. 9, No. 2, February 1991, pages 291 to 295. In those fiber amplifier modules, the active laser medium contained in the light-signal-amplifying section of fiber is erbium, $Er^{3+}$ ions to be exact. The pump laser is a semiconductor laser, also called "laser diode". It emits light at a wavelength of 980 nm. This light, called "pump light", is fed into the $Er^{3+}$-doped fiber section through a fiber-optic coupler. The pump laser is driven by a direct current as an operating current.

Such a drive of the pump laser involves the following problem: The semiconductor laser driven by the direct current is generally single-mode, i.e., it emits light at a single wavelength, e.g., 980 nm, or it emits in only few modes, i.e., it emits light with two or more wavelengths, e.g., with three wavelengths of 978 nm, 980 nm, and 982 nm. In such modes of operation, a semiconductor laser is sensitive to back reflections of the pump light. Such back reflections of the pump light generated by the pump laser can occur at all points in the propagation path where refractive-index step differences are present, e.g., in the area of the fiber-optic coupler, at the ends of the erbium-doped fiber section or at a succeeding isolator. This changes the efficiency of the semiconductor laser; the pump light reflected back may cause variations in the intensity of the pump light emitted by the semiconductor laser since the active layer of the semiconductor laser, together with a part of the transmission link (i.e., up to the point of the refractive-index step difference), acts as a laser resonator. This results in a change in the wavelength of the pump light emitted by the pump laser and, on the other hand, causes the intensity of the pump light to oscillate. Particularly if the oscillations occur in the low-frequency range, e.g., in the hertz or kilohertz range, the amplifying effect of the fiber section will be temporarily neutralized: under certain circumstances, the optical transmission may even be interrupted.

If two pump lasers (both semiconductor lasers) are present (known from K. Nakagawa et al, "Trunk and Distribution Network Application of Erbium-Doped Fiber Amplifier", Journal of Lightwave Technology, Vol. 9, No. 2, February 1991, pages 198 to 208, particularly FIG. 3c on p. 199), the problem described exists for each of the two pump lasers. Another problem in that case is that residual pump light from each of the pump lasers reaches the respective other, opposite pump laser and causes optical instabilities, which, in turn, lead to the above-described gain-variation problems. Therefore, optical isolators are generally used in front of the pump lasers.

As a solution to the problem just described, the prior European Patent Application EP 92906005 proposes to modulate the direct current commonly used as operating current by an alternating current, with the frequency of the alternating current lying above a frequency determined by the reciprocal lifetime of that energy level of the active laser medium whose decay causes the amplification of the light signals.

DISCLOSURE OF INVENTION

It is an object of the invention to provide another solution to the problem of designing an optical amplifier with one or more pump lasers which ensures interference-free amplification of the light signals.

According to the present invention, the operating current is a direct current having a noise current superimposed thereon, the spectral components of the noise current having frequencies which lie above a reciprocal lifetime of an energy level of the active laser medium which causes amplification of light signals.

Over prior art fiber amplifiers, the invention has the advantage of eliminating the need for the costly installation of optical isolators between the pump laser and the fiber-optic coupler to prevent the pump light from being reflected back into the pump laser.

The reason for the fact that the pump laser driven in accordance with the invention has the desired property of making available the pump light for the light-amplifying fiber section with constant intensity is as follows. The superimposed noise current causes the operating current of the laser to vary constantly and irregularly, which results in the distribution of the energy of the pump light to the various modes varying constantly, and in a multitude (20–30) of modes being excited, some simultaneously, some in rapid succession. In other words, the so-called mode distribution of the laser varies constantly, so that the resonance conditions for light reflected back vary constantly. As a result, the above-described adverse effects of reflected pump light on the emission wavelength and intensity of the pump light are highly improbable, so that the feedback sensitivity of the pump laser and, consequently, the stability of the light-signal amplification in the fiber section are greatly improved.

As a result of the measure according to the invention, however, the intensity of the pump light which is absorbed by the active laser medium contained in the fiber section 2 is characterized by noise. To prevent this noise from affecting the amplification of the light signals to be transmitted, according to the invention, the noise current superimposed on the direct current is filtered in such a way that its spectral components have frequencies which lie above the reciprocal lifetime of that excited energy level of the active laser medium which causes the amplification of the light signals to be transmitted. In this manner, variations in the intensity of the pump light are not "perceived" by the active laser medium.

In further accord with the present invention, to generate the noise current, the operating-current source includes essentially a noise generator and means for amplifying, high-pass-filtering and limiting the noise voltage generated.

In still further accord with the present invention, if two pump sources are coupled to the section of fiber which contains the active laser medium, there may be provided a single source for generating the noise currents contained in the operating currents for the two pump sources and means for generating two different noise currents from the output current of the source.

These and other objects, features and advantages of the present invention will become more apparent in light of the following detailed description of a best mode embodiment thereof, as illustrated in the accompanying drawing.

BEST MODE FOR CARRYING OUT THE INVENTION

Figure 1:
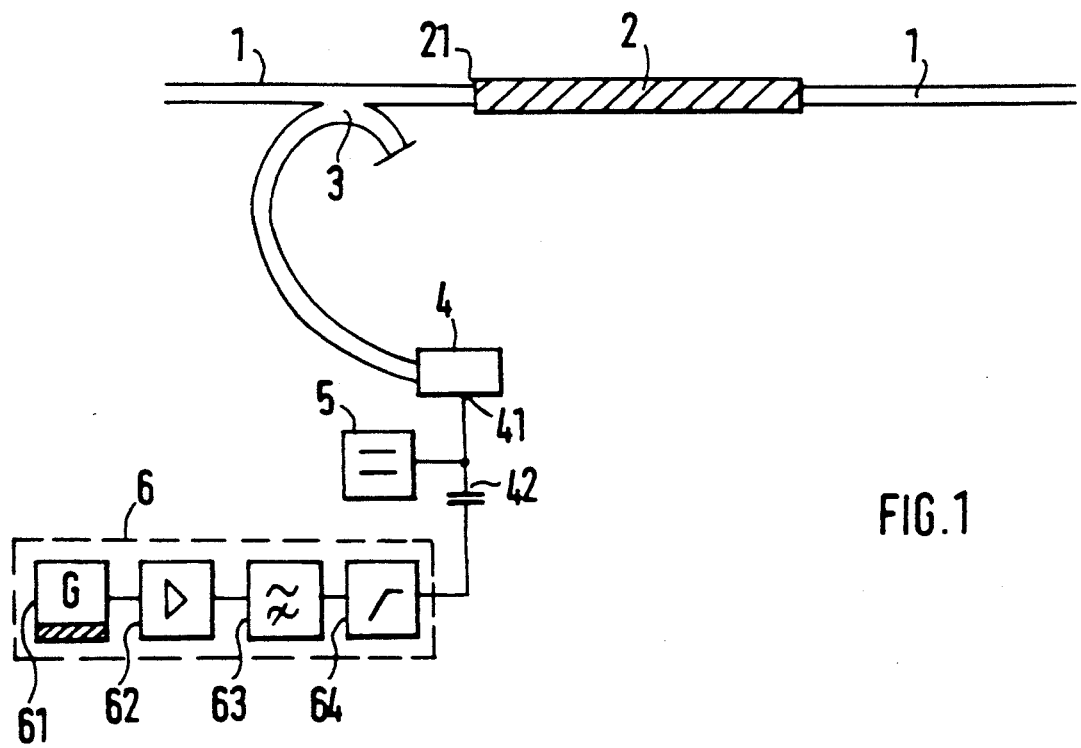
FIG. 1 shows an optical amplifier according to the invention with a single pump laser.

Referring to FIG. 1, there may be shown a fiber-optic transmission link 1 containing a fiber-optic amplifier. Typical of such an amplifier is a fiber section 2 doped with an active laser medium, e.g., erbium, a fiber-optic coupler 3, and a pump laser 4. The fiber section 2 is coupled at a first end 21 via the fiber-optic coupler to the pump laser 4, so that the pump light generated by the pump laser 4 is coupled into this end 21 of the fiber section. The pump laser 4 is a semiconductor laser, such as an InGaAsP/InP, InGaAs/AlGaAs or GaAlAs/GaAs laser, which emits light in the wavelength range of 980 nm. On the fiber-optic transmission link 1, light signals are transmitted, and in the fiber section 2, they are amplified. The light signals have a wavelength of, e.g., 1550 nm. The direction in which the light signals pass through the optical waveguide 1 and the fiber section 2 is immaterial to the invention. Via an electrical connection 41, the pump laser 4 is connected to a direct-current source 5. As far as described, the fiber-optic amplifier of FIG. 1 is identical to the prior art amplifier.

According to the invention, the operating current for the pump laser 4 is not a direct current, but a direct current with a superimposed noise current. To this end, a noise-current source 6 having its output coupled through a coupling capacitor 42 to the operating-current input 41 of the pump laser 4 is provided at the direct-current source 5. Thus, in addition to the direct current from the direct-current source 5, a noise current from the noise-current source 6 flows through the coupling capacitor into the pump laser 4. In other words, the operating current for the pump laser consists of a direct current having a noise current superimposed thereon.

How the noise current affects the amplification of the light signals was explained above.

The noise-current source 6 provided in accordance with the invention does not require a large amount of circuitry. Any noise-current source is suitable which generates at its output a noise current with the necessary fluctuations, with the noise-frequency spectrum lying above a minimum frequency which, as explained above, is determined by the lifetime of that energy level of the active laser medium in the fiber section 2 which is responsible for the light amplification.

This frequency is approximately 1 MHz. In the following, an example of a suitable noise-current source 6 will be explained. As shown in FIG. 1, the components of the noise-current source 6 may include a noise generator 61, an amplifier 62, a high-pass filter 63, and an amplitude limiter 64. The noise generator 61 can be implemented, for example, with a zener diode whose cathode is connected through a resistor to a positive DC bias and whose anode is grounded, as is known from DE-C2 28 20 426. The voltage across a zener diode thus operated is extremely noisy. It is amplified in the amplifier 62, then filtered in the high-pass filter 63, so that it only contains spectral components with frequencies above the cutoff frequency of about 1 MHz, and then passes through the amplitude limiter 64, which limits the amplitudes of the noise current to a maximum value and thereby ensures that no excessive current can flow through the laser 4 which could destroy the laser.

Many types of noise-current sources 6 are possible and maybe used. FIG. 1 shows only exemplary functional features. The noise generator 61, for example, can also be implemented with two zener diodes whose respective cathodes are connected through a resistor to a positive DC bias and whose anodes are grounded. The voltage between the two cathodes is then also extremely noisy. It is also amplified in an amplifier, filtered in a high-pass filter, and passes through an amplitude limiter. The amplifier may be a multistage amplifier, and the high-pass filter may consist of two or more stages, too. For high-pass filtering, capacitors may be provided between the individual amplifier stages and at the output of the last amplifier stage.

Since the noise-current source 6 is a high-frequency device, it should, like any high-frequency device, be shielded from all other electrical parts of the system. Shielding a source of noise, however, is not a particularly critical problem. If spectral components should couple to other electrical parts of the system in spite of the shielding, such spectral components will not cause any major signal-transmission errors since they have a low power density, as is typical of noise.

A typical advantage of a noise-voltage source is that it is equally suitable for semiconductor lasers which differ in their mode spectra due to spreads between units. Hence, adaptation to a specific unit of a particular type of pump laser is not necessary.

As mentioned above, if two pump lasers are present which feed pump light into the amplifying fiber section, the feedback-sensitivity problem exists for each of the two lasers. As a rule, a separate direct-current source is present for each of the two pump lasers. A possible solution consists simply of providing a noise-voltage source at each of the two pump lasers which supplies the respective pump laser with a noise current that is superimposed on the direct current. Thus, an operating-current source as is shown in FIG. 1 for a single pump laser is provided for each of the two pump lasers. In that case, the noise currents flowing through the two pump lasers are not correlated, so that the mode distributions of the two pump lasers caused by these currents are not correlated, either. Thus it is sufficiently improbable that pump light from one of the two pump lasers can interfere with the emission of pump light from the other pump laser.

Figure 2:
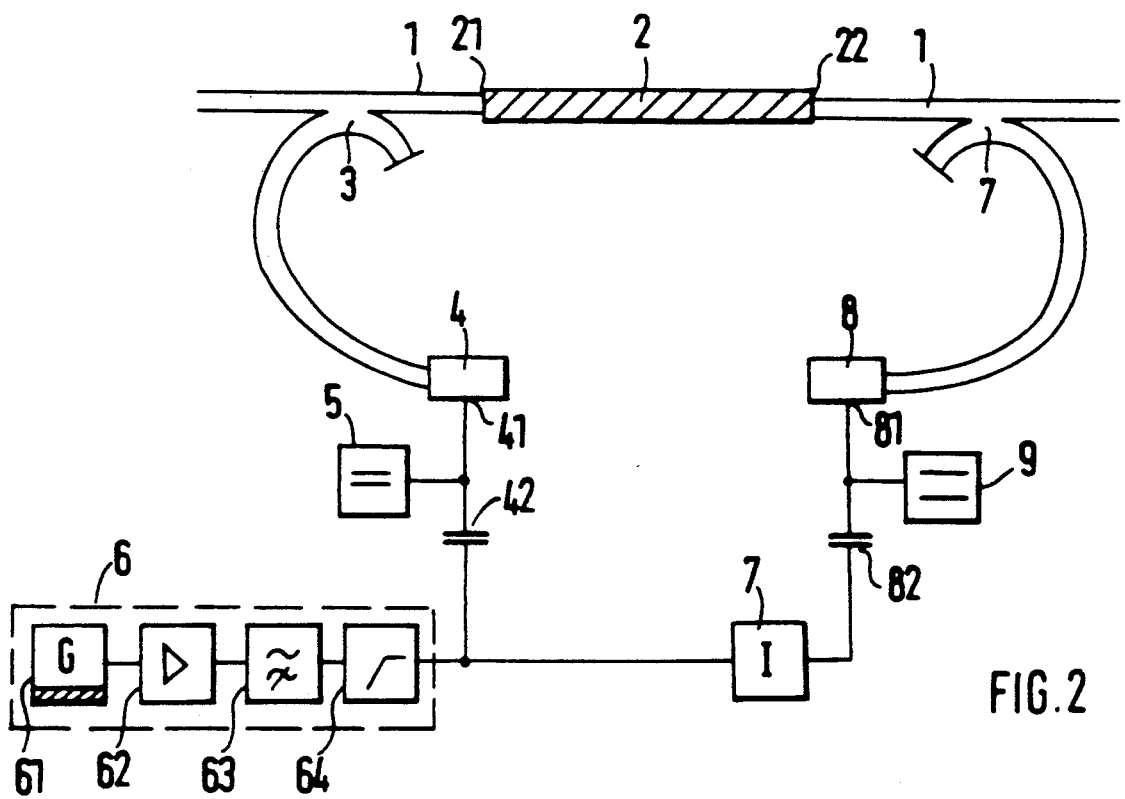
FIG. 2 shows an amplifier according to the invention with two pump lasers.

This can also be achieved by feeding a noise current from a single noise-current source 6 into both pump lasers and ensuring that the noise currents fed into the lasers differ, as shown in FIG. 2. This can be accomplished by inverting the noise current flowing into one of the two pump lasers and not inverting the noise current flowing into the other. This is indicated in FIG. 2 by an inverter 7, through which the noise current from the noise-current source 6 flows into the second pump laser 8. Instead of an inverter, any means may be provided which changes one of the noise currents relative to the other in phase, thus ensuring that the two pump lasers are not operated with exactly the same noise current. This can also be achieved by using in the noise-current source an amplifier with two complementary outputs and coupling one output (through a high-pass filter and an amplitude limiter) to one of the pump lasers and the other output to the other pump laser.

For the rest, all explanations of the noise-current generation given in connection with FIG. 1 apply equally to the embodiment of FIG. 2. The left-hand portion of the embodiment of FIG. 2 corresponds exactly to the embodiment of FIG. 1, so that this portion need not be explained again. The fiber section 2 is coupled at a second end 22 via a fiber-optic coupler 7 to the second pump laser 8. The operating-current input 81 of this second pump laser is connected to the output of a direct-current source 9 and, through a coupling capacitor 82, to the output of the above-mentioned inverter 7 or of a phase shifter or to a second output of the noise-current source 6.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. A fiber-optic amplifier comprising a light-signal-amplifying section of fiber (2) which contains an active laser medium and is coupled to at least one semiconductor laser (4) which serves as a pump source and can be activated by an operating current from an operating-current source (5, 6), wherein the operating current is a direct current having a noise current superimposed thereon, the spectral components of the noise current having frequencies which lie above a reciprocal lifetime of an energy level of the active laser medium which causes amplification of light signals.

2. An amplifier as claimed in claim 1, wherein to generate the noise current, the operating-current source (5, 6) includes essentially a noise generator (61) and means for amplifying (62), high-pass-filtering (63), and limiting (64) the noise voltage generated.

3. An amplifier as claimed in claim 1 wherein, if two pump sources (4, 8) are coupled to the section of fiber (2), there are provided a single source (6) for generating the noise currents contained in the operating currents for the two pump sources (4, 8) and means (7) for generating two different noise currents from the output current of the source (6).

4. An amplifier as claimed in claim 2, wherein, if two pump sources (4, 8) are coupled to the section of fiber (2), there are provided a single source (6) for generating the noise currents contained in the operating currents for the two pump sources (4, 8) and means (7) for generating two different noise currents from the output current of the source (6).

* * * * *